United States Patent [19]

Wagers

[11] Patent Number: 4,870,376

[45] Date of Patent: Sep. 26, 1989

[54] MONOLITHIC ELASTIC CONVOLVER OUTPUT CIRCUIT

[75] Inventor: Robert S. Wagers, Richardson, Tex.

[73] Assignee: Texas Instruments Incorporated, Dallas, Tex.

[21] Appl. No.: 561,771

[22] Filed: Dec. 15, 1983

[51] Int. Cl.⁴ ........................ H03H 9/00; H04B 11/00

[52] U.S. Cl. .................................... 333/150; 333/154; 333/193

[58] Field of Search ............... 333/150, 151, 153, 154, 333/128, 191-194; 364/821

[56] References Cited

U.S. PATENT DOCUMENTS

| | | | |
|---|---|---|---|
| 4,037,174 | 7/1977 | Moore et al. | 364/821 |
| 4,101,965 | 7/1978 | Ingebrigsten | 364/821 |
| 4,245,333 | 1/1981 | Jelks | 333/150 |
| 4,386,324 | 5/1983 | Schellenberg | 333/128 |
| 4,388,599 | 6/1983 | Gautier et al. | 364/821 |

OTHER PUBLICATIONS

Skitek et al., *Electromagnetic Concepts and Applications,* 1982, pp. 400–406.

Franke and Noorani, Wilkinson Hybrid with Quarter-Wave Offset, RF Design, Nov./Dec. 1981, vol. 4, No. 6, pp. 32–38.

Colvin, Carr, Roberts and Charlson, UHF Elastic Convolver with Improved Efficiency, IEEE Trans. on Sonics & Ultrasonics, vol. SU-29, No. 2, Mar. 1982.

*Primary Examiner*—Thomas H. Tarcza
*Assistant Examiner*—Gregory C. Issing
*Attorney, Agent, or Firm*—Carlton H. Hoel; James T. Comfort; Melvin Sharp

[57] ABSTRACT

The disclosure relates to a microstrip circuit which is used to combine the energy output from the convolving plate of a surface acoustic wave (SAW) monolithic elastic convolver. The convolving plate is tapped at its two ends and a Wilkinson combiner is used to sum the signals that propagate to the ends of the plate. The Wilkinson combiner is a three-port device with the two arms that couple to the convolver plate having their characteristic impedances set to match that of the acoustic waveguide. In view of the impedance match, no electromagnetic reflections are produced at the end of the convolving plate and all of the energy incident on the Wilkinson combiner is summed and delivered to the output port of the combiner. Additionally, the microstrip circuit has an impedance transformer to transform down to an impedance suitable for driving an output amplifier chain of a receiving system.

In accordance with a second embodiment of the invention, a plurality of convolvers is connected together in a Christmas tree-type of arrangement to maintain spatial amplitude uniformity while minimizing the phase delay that occurs from propagation from the center of the elastic convolver to the outer extremes thereof.

In accordance with a third embodiment of the invention, the Wilkinson convolvers of FIG. 2 are replaced by microstrips configured to sum the outputs from all of the convolver sections without reflections. This embodiment provides an impedance matched to the driving segments of the convolving plate and produces broad band power combining internal to the microstrip of the output circuit. This embodiment eliminates potential losses within the microstrip circuit from power dissipation in lumped resistors inherent in the Wilkinson embodiment.

4 Claims, 3 Drawing Sheets

MONOLITHIC ELASTIC CONVOLVER OUTPUT CIRCUIT

BACKGROUND OF THE INVENTION

1. Field of the Invention

This invention relates to surface acoustic wave (SAW) monolithic elastic convolvers (MEC) for forming a correlation between two acoustic signals propagating under an acoustic waveguide.

2. Description of the Prior Art

Monolithic elastic convolvers, which are well known in the art, form a correlation between two acoustic signals propagating under an acoustic waveguide. The acoustic waveguides in practice are formed from certain known metals on a substrate of (YZ) $LiNbO_3$. The acoustic waveguide which also functions as a convolution plate tends to be from an inch to several inches long and at the output frequencies of these devices, typically 500-800 MHz, the convolution plate is comparable to an electromagnetic wavelength on the convolution plate. The problem for the convolver designer is to sum all of the signals present on the $LiNbO_3$ convolving plate without suffering losses of signal strength due to phase delays in the output circuit and without inducing standing waves on the convolving plate microstrip line by the application of taps which introduce impedance mismatches in the microstrip.

In prior art approaches to this problem, the output microstrip (convolving plate) of the MEC has been bonded out to an output coaxial line and all signals have been allowed to propragate to the output port. With this technique, there is a loss of spatial uniformity due to the reflections that are induced by the impedance mismatch. The convolving plate has also been segmented and each segment bonded out to a summing node which connects to the output coaxial line. With these two approaches there is difficulty in achieving spatial uniformity and in summing the contributions from the various segments equally due to the inductance of the bond leads and due to the absence of electromagnetic impedance matching. In some prior art, attempts have been made to minimize the spatial non-uniformity in the convolving plate output by loading the ends of the waveguide with resistors that are matched to the impedance of the waveguide. This technique eliminates reflections from the ends of the convolving plate and thus promotes spatial uniformity, however, it has the disadvantage of dissipating output energy. Alternatively, there have been efforts to tune the ends of the waveguide with an inductor to achieve a compromise between spatial uniformity and output signal strength. Again, with this approach the spatial uniformity is not as good as is desired.

SUMMARY OF THE INVENTION

In accordance with the present invention, the above noted problems of the prior art are substantially reduced. Briefly, there is provided a microstrip circuit which is used to combine the energy output from a convolving plate of a monolithic elastic convolver. In its simplest form, the convolving plate is tapped at its two ends and a simple Wilkinson combiner is used to sum the signals that propagate to the ends of the plate. The Wilkinson combiner in the present preferred embodiment is a three-port device with the two arms that bond to the convolver plate having their characteristic impedances set to match that of the acoustic waveguide. Because of the impedance match, no electromagnetic reflections are produced at the end of the convolving plate and all energy incident on the Wilkinson combiner is summed and delivered to the output port of the combiner. The microstrip also has an impedance transformer to transform down to an impedance suitable for driving the output amplifier chain of a receiving system.

In accordance with a second embodiment of the invention, a plurality of Wilkinson combiners is connected together in a Christmas tree-type of arrangement to maintain spatial amplitude uniformity while minimizing the phase delay that occurs from propagation from the center of the elastic convolver to the outer extremes thereof.

In accordance with a third embodiment of the invention, the Wilkinson combiners of FIG. 2 are replaced by microstrips configured to sum the outputs from all of the convolver segments without reflections. This embodiment provides an impedance matched to the driving segments of the convolving plate and produces broad band power combining internal to the microstrip of the output circuit. This embodiment eliminates potential losses within the microstrip from power dissipation in lumped resistors inherent in the Wilkinson embodiment.

DESCRIPTION OF THE PREFERRED EMBODIMENTS

Figure 1:
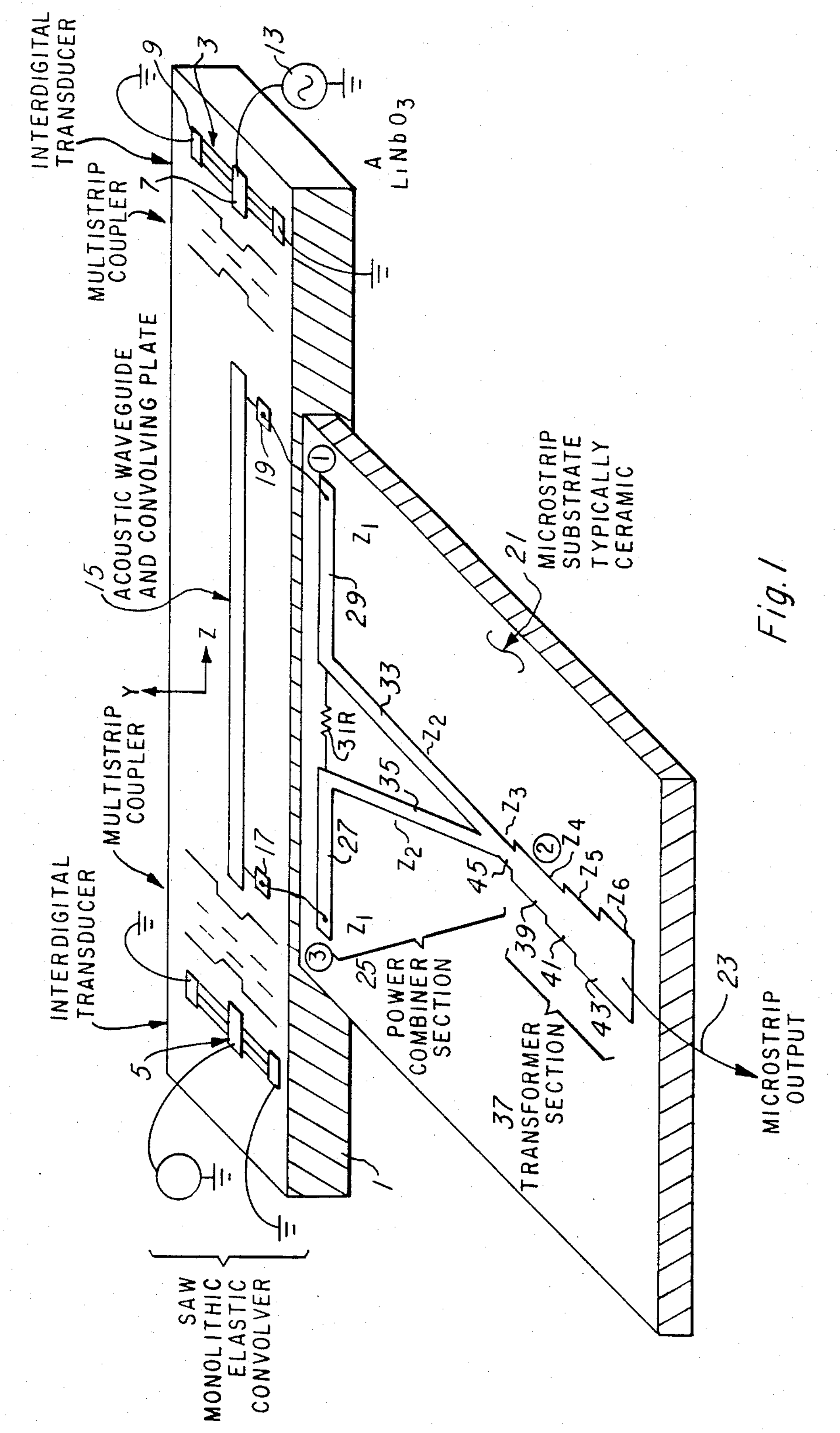
FIG. 1 is a circuit diagram of a monolithic elastic convolver output circuit in accordance with the present invention.

Referring to FIG. 1, there is shown a surface acoustic wave monolithic elastic convolver output circuit which comprises a lithium niobate crystal 1 in the shape of a rectangular parallelepiped. Crystals of this type are commercially available and their production is a well developed technology. It is known that when crystals of this type are forced into strain of sufficient amplitude, they become non-linear and, as a consequence thereof, they are capable of mixing two signals at two different frequencies or at the same frequency to produce an output that is mathematically represented as the product of the amplitudes of the two input complex waves at a frequency which is the sum of the frequencies of the two signals. The signals are applied to the crystal 1 in the preferred embodiment by means of interdigitated transducers 3 and 5 at opposite ends of the crystal. The transducers 3 and 5 in the preferred embodiment are identical and, as can be seen in the case of transducer 3, the signal is applied to a pad 7 having a pair of legs extending in each direction therefrom with other pads 9 and 11 with legs disposed between the legs of the pad 7, the pads 9 and 11 being connected to ground or other reference potential. A signal force is applied to the pad or electrode 7 by the generator 13 which produces an alternating electric field in the crystal 1 which produces a wave that is the exact equivalent of an earthquake surface wave of the type called Rayleigh waves or, in present day technology, surface acoustic waves (SAWs). These waves are allowed to propagate along the surface of the lithium niobate crystal toward the opposite end thereof.

To perform the equivalent of the mathematical operation of convolution, energy from the interdigitated transducer 3 and/or 5 is propagated along the crystal 1 and the waves produced in the crystal are compressed in width to very narrow transverse dimensions on the order of about three wavelengths. The enrgy, when compressed, is injected to an acoustic waveguide and convolving plate 15 and travels thereunder. A reason for the energy compression is to provide a very high power density in the crystal and force the crystal to greater extremes of distention. The acoustic wave generated at transducer 3 travels along the crystal 1 and is compressed into the acoustic waveguide 15 and travels under the waveguide for some distance to the other end thereof. In practice, the waveguide 15 is on the order of length to contain the wave for about twenty microseconds. If the signal launched at transducer 3 enters the acoustic waveguide 15, about twenty microseconds of signal is contained inside the waveguide when the front end of the wave has reached the distant end of the waveguide.

If a similar exciting and energy compression structure is provided at the other end of the crystal 1 at transducer 5 and the signal from transducer 5 is also compressed and placed into the waveguide 15 from the opposite end of the waveguide, that signal will also be contained in the waveguide along with the signal from transducer 3. The crystal 1, being driven non-linearly at every position along the length of the waveguide, will produce a product of the amplitude of these two signals at the sum of the frequencies of the two signals at the outputs 17 and 19 of the waveguide 15. The signal that results from the product of the two waves is a direct mixing operation so that, if each of the signals was at a frequency Ω, the product signal would come out at a frequency 2 Ω and there is provided a mixing event occurring at every incremental length along the waveguide. The waveguide 15 is formed from a metal, preferably aluminum. The waveguide 15 effectively performs an integration along the length thereof summing all of the product signals at once and outputting them, thus obtaining a convolution activity where the integral function is performed by the acoustic waveguide. This performs very useful technological functions of pattern recognition, secure communications, coded communications, covert communications, low probability of intercept radar and the like.

As stated above, in the prior art, there has been a problem in outputting the signal on the waveguide 15. The microstrip or waveguide 15 acts in the manner of an electromagnetic transmission line and the signal becomes distorted. The problem is to obtain the signal from the microstrip in undistorted fashion so that it performs a good power match, does not distort the phase and maintains the amplitude uniform in frequency and position along the waveguide. The improvement herein is in a particular kind of matching circuit in which the matching circuit itself is another microstrip as the one illustrated in FIG. 1.

To obtain an undistorted output from the acoustic waveguide 15, a second microstrip circuit 21 is provided which is connected to both ends of the microstrip 15. Impedance of the second microstrip circuit 21 is chosen to give a good impedance match to the microstrip 15 so that reflections are not provided at the end of the microstrip 15 and all of the power is extracted from the waveguide 15 in a phase-coherent fashion to provide a summation at the output port 23.

The microstrip circuit 21 is a composite of two well known circuits described in the literature, the first is a Wilkinson combiner 25 and the second is a microstrip transformer 37. The Wilkinson combiner 25 is composed of a pair of identical legs 27, 29 connected together by resistor 31 with a pair of legs 33 and 35 in the shape of a V, the legs 33 and 35 also being substantially identical to each other. Legs 33 and 35 are connected to the output leg 45 of the Wilkinson combiner. A Wilkinson combiner is a particular type of microstrip circuit in which the two legs 27, 29 of the microstrip circuit are joined by a resistor 31. All arms of the Wilkinson portion are not of equal immpedance, the impedances being chosen such that good impedance matching across the band of operation is achieved. The second section shown on the microstrip circuit is the transformer 37 in which several sections of microstrip are joined together to transform the impedance to a level suitable for driving the output circuit connected to the output terminal 23 of the convolver. The application of such circuits to surface acoustic wave convolvers does not appear in the prior art and the fact that they can be applied to lead to uniform summing of the amplitudes of the product signals from the surface acoustic waveguide with controlled phase characteristics is not reported in the literature.

The value of the resistor 31 and the legs 27 and 29 must be carefully chosen so that they have a good impedance match from any leg of the Wilkinson combiner to the convolver waveguide 15. The match makes it so that there are no reflections back from the connection point of the Wilkinson combiner to the waveguide 15. Energy coming into the Wilkinson combiner at the legs 27 and 29 will be transmitted to the transformer section 37. The transformer has three sections shown, these being labelled 39, 41 and 43 respectively, each of slightly wider dimension for the purpose of impedance matching as mentioned hereinabove. In practice, the center element 45 and the first leg of the transformer 39 can be combined by some averaging of width to provide a single width element for the two portions.

The purpose of the device of FIG. 1 is to permit summing from the acoustic integrator of the frequencies across the band of operation of the device in a fashion that will allow the amplitude not to be altered by the summing mechanism.

Figure 2:
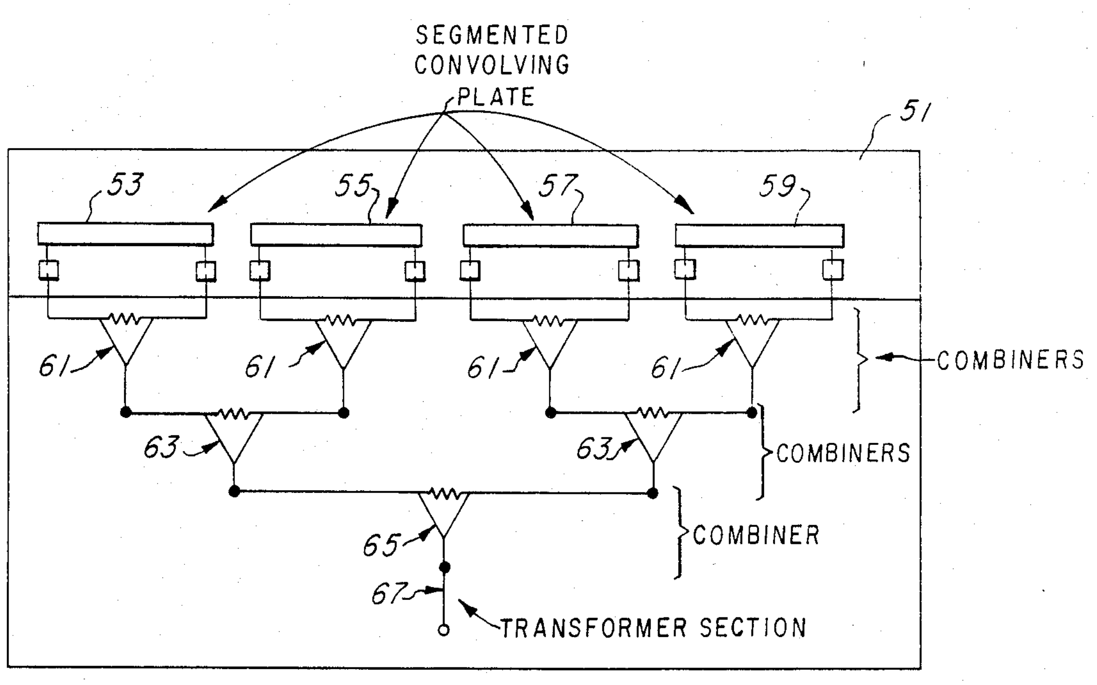
FIG. 2 is a circuit diagram of a segmented acoustic waveguide with cascaded Wilkinson circuits in a Christmas tree arrangement in accordance with the present invention.

Referring now to FIG. 2, there is shown a second embodiment of a monolithic elastic convolver. The embodiment of FIG. 2 is designed to overcome certain problems encountered in the improved embodiment of FIG. 1. A weakness of the FIG. 1 approach is that there are still phase differences between signals propagating from positions toward the center of the convolving plate 15 and those signals generated near the ends of the convolving plate. In accordance with the embodiment of FIG. 2, this deficiency is minimized by cascading a number of Wilkinson circuits and segmenting the acoustic waveguide of the FIG. 1 embodiment. Thus, each piece of the segmented acoustic waveguide is summed by a Wilkinson combiner and the outputs from those Wilkinson combiners are summed in yet another tire of Wilkinson combiners in a Christmas tree-type configuration. This embodiment has the virtue of maintaining spatial amplitude uniformity while minimizing the phase delay that occurs from propagation from the center of the convolver to the outer extremes thereof.

Referring now to FIG. 2 more specifically, there is shown the lithium niobate crystal 51 having an acoustic waveguide or convolving plate formed in four sections labelled 53, 55, 57 and 59. The ends of each of the segments of the convolving plates 53 to 59 each provide an output, each to a separate Wilkinson combiner 61, the outputs of each pair of Wilkinson combiners being combined in a second tier of Wilkinson .combiners 63, the outputs of the combiners 63 being combined in a Wilkinson combiner 65 tot provide a summed output. The output of the Wilkinson combiner 65 is then passed to a transformer section 67, the same as the transformer section 37 of FIG. 1 for impedance matching. The elements of FIG. 2 themselves operate in the same manner as described hereinabove with regard to the embodiment of FIG. 1 except for the advantages derived from use of the segmented convolving plates and the Christmas tree arrangement of the Wilkinson combiners.

Figure 3:
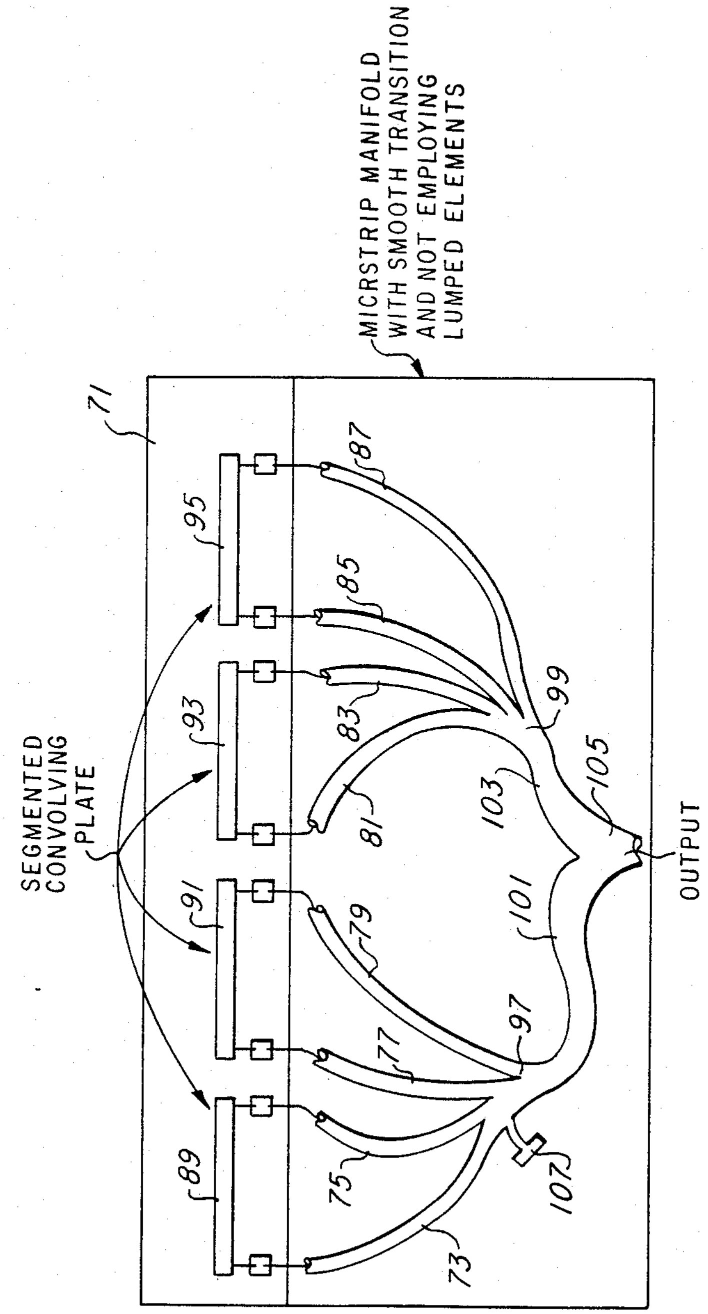
FIG. 3 is an embodiment of the invention as in FIG. 2 with the Wilkinson combiners being replaced by an equivalent microstrip circuit.

Referring now to FIG. 3, there is shown a further embodiment of the invention wherein the Wilkinson combiners of the embodiment of FIG. 2 are replaced by a microstrip manifold with smooth transitions and wherein resistive lumped elements are eliminated. As can be seen with reference to FIG. 3, the segmented convolving plate 71 is identical to that of the plate 51 of FIG. 2. However, the Wilkinson combiners have been replaced by a microstrip manifold with smooth transitions wherein a plurality of microstrips 73 through 87 are provided, each of the microstrips being coupled to an end of one of the segments 89 through 95 of the convolving plate. The path lengths of each of the microstrips is adjusted so that signals from each of the microstrips 73 through 79 arrives at the summing point 97 at the same time and the signals on each of the microstrips 81 through 87 arrives at the summing point simultaneously, the outputs from the summing points 97 and 99 passing along the microstrip portions 101 and 103 to the summing point 105 which is the output terminal. The length of the paths of the microstrip portions 101 and 103 are also adjusted so that the signals from the summing points 97 and 99 will arrive at the output 105 simultaneously for summation. The microstrips 73 through 87 can be adjusted in width so that each of the microstrips need not be of uniform width in order to prevent and adjust for reflection and the like. Alternatively or in addition, stubs or the like 107 can be judicially positioned in the microstrip circuit to adjust for such reflections. Thus, the manifold provides an impedance match to the driving segments of the convolving plate and produces broad band power combining internal to the microstrip of the output circuit. This embodiment has the virtue of eliminating potential losses within the microstrip from power dissipation in the lump resistors inherent in the Wilkinson embodiment.

Though the invention has been described with respect to speciic preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A convolver circuit comprising, in combination,
(a) a surface acoustic wave monolithic elastic convolver, said convolver including a convolving plate,
(b) a Wilkinson combiner having input legs coupled across end portions of said convolving plate and impedance matched thereto to minimize reflections therefrom and an output, and
(c) a microstrip transformer coupled to the output of said Wilkinson combiner wherein said Wilkinson combiner includes a pair of legs coupled to the ends of said convolving plate, said legs forming a single leg at one end thereof and a resistor coupled across the midpoints of each of said legs, the value of said resistor selected to control minimization of reflection.

2. A convolver circuit comprising, in combination,
(a) a surface acoustic wave monolithic elastic convolver, said convolver including a convolving plate having a plurality of adjacent spaced sections,
(b) a first plurality of Wilkinson combiners, each Wilkinson combiner having input legs coupled across end portions of one of said sections and impedance matched to said section to minimize reflections therefrom and an output,
(c) second Wilkinson combiner means connected to the outputs of a pair of said first plurality of Wilkinson combiners in a Christmas tree circuit arrangement, said second Wilkinson combiner means having an output, and
(d) output means coupled to said output of said second Wilkinson combiner means, said output means including a microstrip transformer.

3. A convolver circuit as set forth in claim 2 wherein each said Wilkinson combiner includes a pair of legs coupled to the ends of said convolving plate, said legs forming a single leg at one end thereof and a resistor coupled across the midpoints of each of said legs, the value of said resistor selected to control minimization of reflection.

4. A convolver circuit as set forth in claim 2 wherein said microstrip transformer comprises a plurality of coupled transformer sections, one of said sections coupled to said output of said Wilkinson combiner, said sections being of progressively greater width, to match the impedance of said output of said Wilkinson combiner to a circuit external to said convolver circuit.

* * * * *